United States Patent [19]
Matsuoka

[11] Patent Number: 5,700,155
[45] Date of Patent: Dec. 23, 1997

[54] SOCKET FOR IC PACKAGE

[75] Inventor: Noriyuki Matsuoka, Yokohama, Japan

[73] Assignee: Yamaichi Electronics Co., Ltd., Tokyo, Japan

[21] Appl. No.: 580,055

[22] Filed: Dec. 20, 1995

[30] Foreign Application Priority Data

Dec. 21, 1994 [JP] Japan .................................. 6-336151

[51] Int. Cl.$^6$ ............................................. H01R 11/22
[52] U.S. Cl. ..................................................... 439/266
[58] Field of Search ........................... 439/266, 269.1, 439/264

[56] References Cited

U.S. PATENT DOCUMENTS 5,205,756  4/1993  Myers ........................ 439/266
5,395,260  3/1995  Hayakawa et al. ............ 439/266

*Primary Examiner*—P. Austin Bradley
*Assistant Examiner*—Yong Ki Kim
*Attorney, Agent, or Firm*—Wenderoth, Lind & Ponack

[57] ABSTRACT

A socket for an IC package includes a socket body having a plurality of contacts arranged thereon so as to be contacted respectively with corresponding leads arranged on the IC packages. Also a contact shutter cover is mounted on an upper surface of the socket body so as to permit upward and downward movement thereof. The contacts are displaced between a contacting position and a contact-releasing position in accordance with the upward and downward movement of the contact shutter cover. The socket for an IC package further includes a positioning device provided on the contact shutter cover and adapted to restrict side surfaces of the leads of the IC package placed in the socket body.

6 Claims, 7 Drawing Sheets

SOCKET FOR IC PACKAGE

BACKGROUND OF THE INVENTION

1. Field of the Invention

This invention relates to a socket for an IC package, in which a contact shutter cover is mounted on an upper portion of a socket body so that contacts are opened and closed by the upward and downward movement of the cover.

2. Brief Description of the Prior Art

Recently, sockets for an IC package of the type having contacts which are opened and closed by upward and downward motion of a manipulator of a robot have been widely used. To fulfill this requirement, there have been widely used sockets of the type having a contact shutter cover mounted on an upper surface of a socket body, contacts retained by a socket body are displaced backwardly into contact-releasing position against resiliency thereof, the IC package is loaded on the socket body in this contact-released state, and then a downwardly-pressing force to the contact shutter cover is removed so that the contacts are displaced forwardly against the resiliency thereof so as to be contacted, under pressure, with upper surfaces of corresponding leads of the IC package.

The contact shutter cover is pushed upwardly by the forwardly displacing contacts, so as to be on standby.

In one such conventional socket, a pressure receiving arm is disposed backwardly from an area in the vicinity of an upper end of each contact, and the pressure receiving arm is pressed by the cover. The cover is provided with partition walls for isolating the pressure receiving arms, so that the cover is moved upwardly and downwardly while restricting the contacts with the partition walls. When the cover is being lowered, the contacts restricted by the partition walls displace the contacts backwardly to establish a contact releasing state. On the other hand, when the cover is being lifted upwardly, the contracts restricted by the partition walls are restored forwardly so as to be contacted with the upper surfaces of corresponding leads thereof under pressure.

That is, the partition walls serve to act as the means for restricting the pressure receiving portion which is pressed by the cover.

In the above-mentioned socket for an IC package, the partition walls for isolating the pressure receiving portions which are subjected to pressure from the contacts are provided on the contact shutter cover so that the partition walls may serve as a means for achieving a correct displacement. However, in order to obtain a correct one-to-one relation between each contact and each lead corresponding thereto, it is required that the contacts and leads are simultaneously correctly positioned.

Also, in order to assuredly obtain a correct positioning of the leads of the IC package by providing a plurality of partition walls, which are interposed between the leads, on the socket body, it is required to make the size or dimension of a space between the partition walls to be interposed between the leads, that is, a slit formed by the partition walls as closer to the width of each lead. If this is done, there is a risk of deforming the leads during the operation of inserting or removing the IC package.

SUMMARY OF THE INVENTION

It is, therefore, an object of the present invention to provide a socket for an IC package in which contacts and leads can simultaneously correctly be positioned.

Another object of the present invention is to provide a socket for an IC package in which IC leads are readily deformed during an operation for inserting and removing an IC package from an IC socket.

In order to achieve the above objects there is essentially provided a socket for an IC package comprising a socket body including a plurality of contacts arranged thereon so as to be contacted respectively with corresponding leads arranged on an IC package, and a contact shutter cover mounted on an upper surface of the socket body for upward and downward movement. The contacts are displaced between a contacting position and a contact-releasing position in accordance with the upward and downward movement of the contact shutter cover. The socket for an IC package further comprises positioning means provided on the contact shutter cover and adapted to restrict side surfaces of the leads of the IC package placed on the socket body.

From another aspect of the present invention, there is also provided a socket for an IC package comprising a socket body including a plurality of contacts arranged thereon so as to be contacted respectively with corresponding leads arranged on an IC packages. Also a contact shutter cover is mounted on an upper surface of the socket body for upward and downward movement. The contacts are displaced between a contacting position and a contact-releasing position in accordance with the upward and downward movement of the contact shutter cover. The socket for an IC package further comprises positioning means provided on the contact shutter cover and adapted to restrict side surfaces of the leads of the IC package placed on the socket body and side surfaces of the contacts.

From a further aspect of the present invention, there is also provided a socket for an IC package comprising a socket body including a plurality of contacts arranged thereon so as to be contacted respectively with corresponding leads arranged on an IC package. A contact shutter cover is mounted on an upper surface of the socket body for upward and downward movement. The contacts are displaced between a contacting position and a contact-releasing position in accordance with the upward and downward movement of the contact shutter cover. The socket for an IC package further comprises positioning means provided on the contact shutter cover and adapted to restrict side surfaces of contact portions between the leads of the IC package placed on the socket body and side surfaces of the contacts.

It is preferred that the contact shutter cover allows the contacts to be displaced into the contacting position when the contact shutter cover is lifted upwardly, and the positioning means is lifted upwardly from under the leads together with the contact shutter cover in order to restrict side surfaces of the leads or the leads and contacts or contacting portions between the contacts and leads.

It is also preferred that the socket body includes a seat surface for supporting an IC package body or the IC leads. The seat surface is provided with a groove for allowing the positioning means to come in and out of the groove when the positioning means is moved upwardly and downwardly together with the contact shutter cover.

The foregoing has outlined some of the more pertinent objects of the present invention. These objects should be construed as being merely illustrative of some of the more prominent features and applications of the invention. Many other beneficial results can be obtained by applying the disclosed invention in a different manner or modifying the invention within the scope of the invention. Accordingly, other objects in a full understanding of the invention may be had by referring to the summary of the invention, the detailed description describing the preferred embodiment in addition to the scope of the invention defined by the claims taken in conjunction with the accompanying drawings.

DETAILED DESCRIPTION OF THE EMBODIMENT

Figure 1:
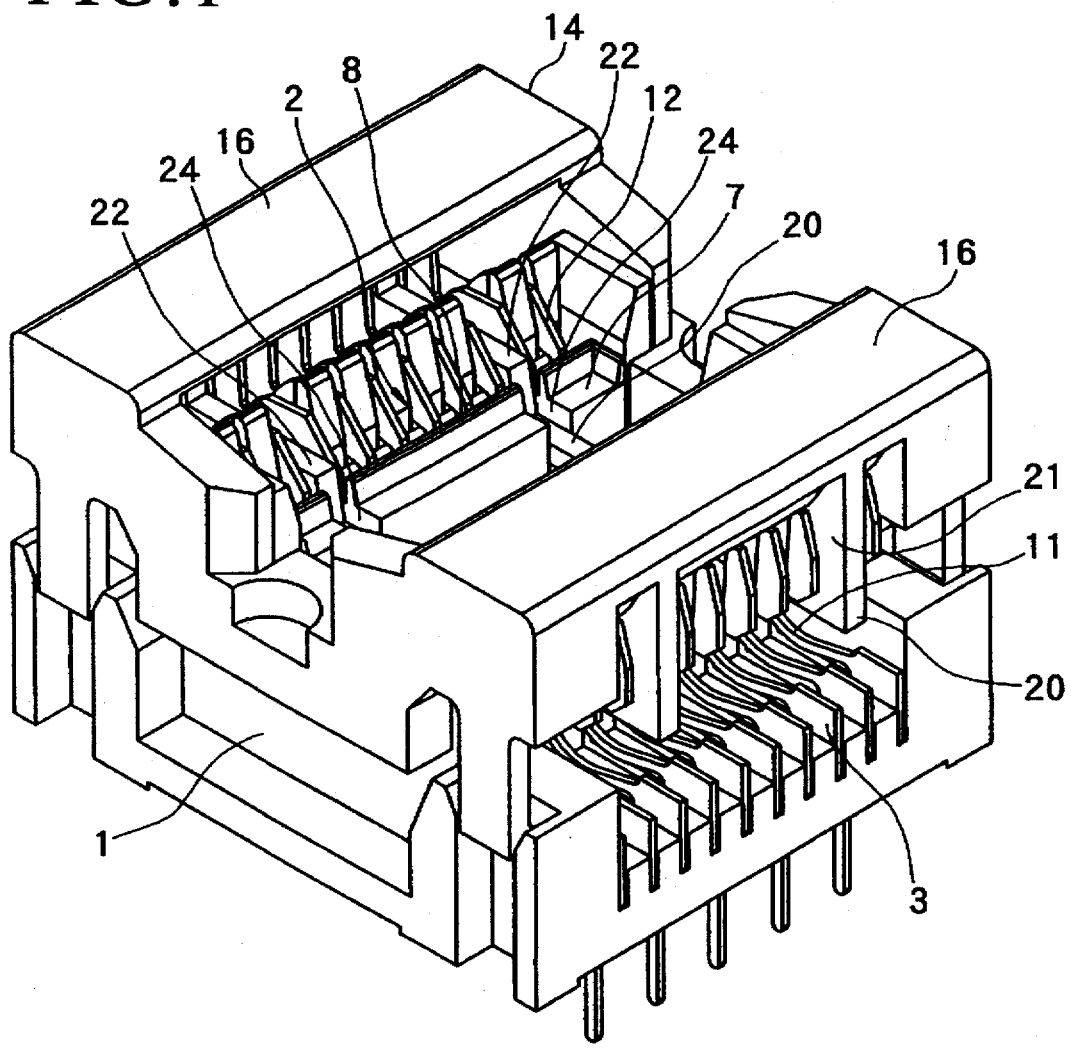
FIG. 1 is a perspective view of a socket for an IC package according to one embodiment of the present invention, in which a contact shutter cover is in its lifted position.

One embodiment of the present invention will now be described in detail with reference to FIGS. 1 through 9 of the accompanying drawing.

As shown in FIGS. 1 through 4, as well as elsewhere, a socket body 1 includes an IC receiving portion 2 formed in a central area of an upper surface thereof, a plurality of contacts arranged in array along opposing two sides of the IC receiving portion 2, and a lead support seat 4 formed on an inner bottom surface of the IC loading portion 2. Leads projecting from opposing side surfaces of an IC package body 5 received in the IC loading portion are supported by the support seat 4.

In FIG. 6, as well as elsewhere, there is illustrated a gull-wing type IC package, as a representative example of the above IC package, in which leads 6 extending from two opposing sides of an IC package body 5 are bent so as to form two stages with its leading end allowed to project generally in a horizontal fashion. The lead support seat 4 supports a lower surface of the leading end portion of each lead 6.

Besides a provision of the lead support seat 4, another support seat 7 for supporting a lower surface of the IC package body 5 may be provided on an inner bottom surface of the IC receiving portion 2.

Further, within an internal area of the lead support seat 4, a rib 8 for restricting a side surface of the IC package body 5 is provided and a loading position for the IC package body 5 is established. At that time, a lower surface of a base portion of each projected IC lead 6 can be restricted by a top face of the rib 8.

On the other hand, as shown in FIG. 5, as well as elsewhere, each contact 3 includes a male terminal 10 implanted in the socket body 1 under the lead support seat 4 end extending downwardly of the socket body 1 from the implanting portion 9, a curved spring portion 11 extending upwardly from the implanting portion 9, and a contact piece 12 continuous with an upper end of the spring portion 11.

The contact piece 12 has a downwardly-directed press-in contact projection 13 arranged in a higher position than the lead support seat 4. As shown in FIG. 7, this projection 13 is brought into press-in contact with the lead 6 which is in contact with the seat surface 4. That is, the lead 6 is resiliently held between the seat surface 4 and the press-in contact projection 13.

A contact shutter cover 14 is mounted in an overlying fashion on the upper surface of the socket body 1 for upward and downward movement. The contact shutter cover 14 has an IC inserting/removing window 15 which is formed at a central portion of the contact shutter cover 14 and opened to a higher position than the IC receiving portion 2. The contact shutter cover 14 has a frame wall for defining the IC inserting and removing window 15. That is, the contact shutter cover 14 exhibits the form of a frame.

In the contact shutter cover 14, a downwardly-pressing control portion 16 is formed by opposing frame walls and a contact press-in portion 17 is formed on a lower surface of the press-in control portion 16.

The contact 3 is provided with a cantilevered arm 18 extending backwardly from the contact piece and a free end (pressure receiving portion) of the cantilevered arm 18 is disposed immediately under the pressing portion 17 of the contact in such a manner as to face therewith.

Figures 6A, 6B:
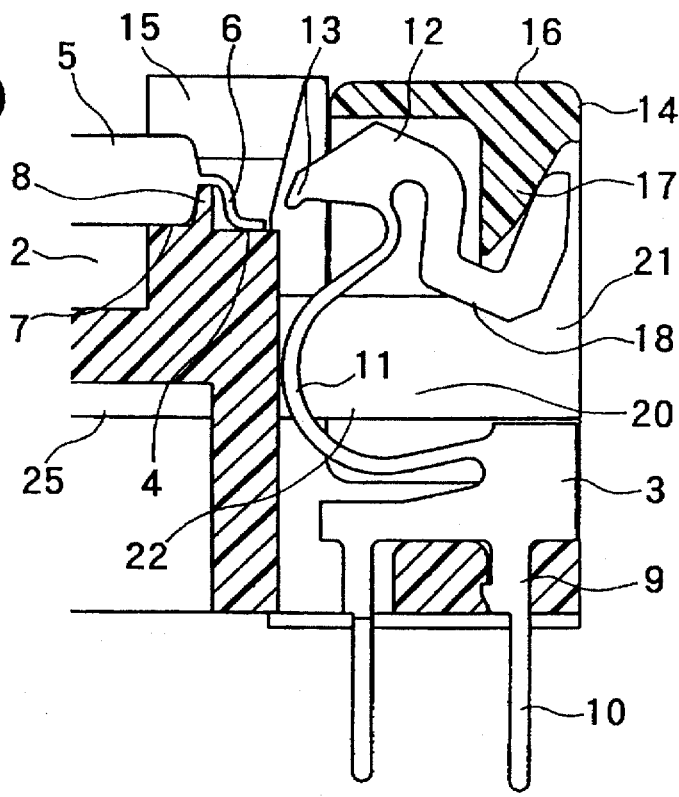
FIG. 6(A) is a sectional view of an important portion of a socket, taken on a line extending along a side surface of a contact when a contact shutter cover is in its lowered position.
FIG. 6(B) is likewise a sectional view of the important portion, taken on a line extending along a separate bar in the state of FIG. 6(A)

As shown in FIG. 6A, downward motion of the cover 14 causes the contact press-in portion 17 to press down the pressure receiving portion of the free end of the cantilevered arm 18 against the spring 11, thereby bringing the contact piece 12 into a backwardly spaced portion away from the IC lead so as to realize a contact-releasing state. In that state, the IC package 5 is inserted and removed from the IC receiving portion 2.

Figure 7A:
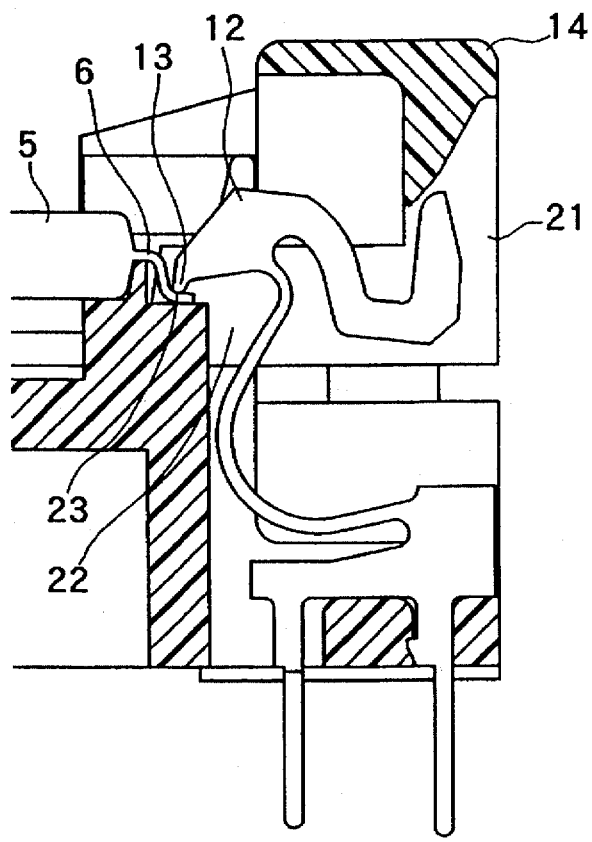
FIG. 7(A) is a sectional view of an important portion of a socket taken on line extending along a side surface of a contact when a contact shutter cover is in its lifted position and the contact is in contact with its corresponding IC lead.
Figure 7B:
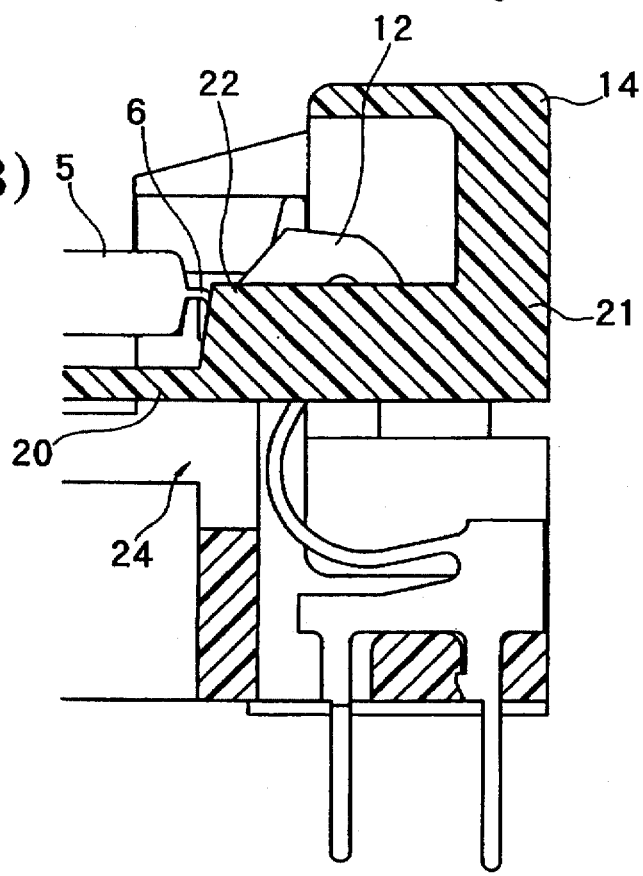
FIG. 7(B) is likewise a sectional view of the important portion taken on a line extending along a separate bar in the state of FIG. 7(A)
Figure 8:
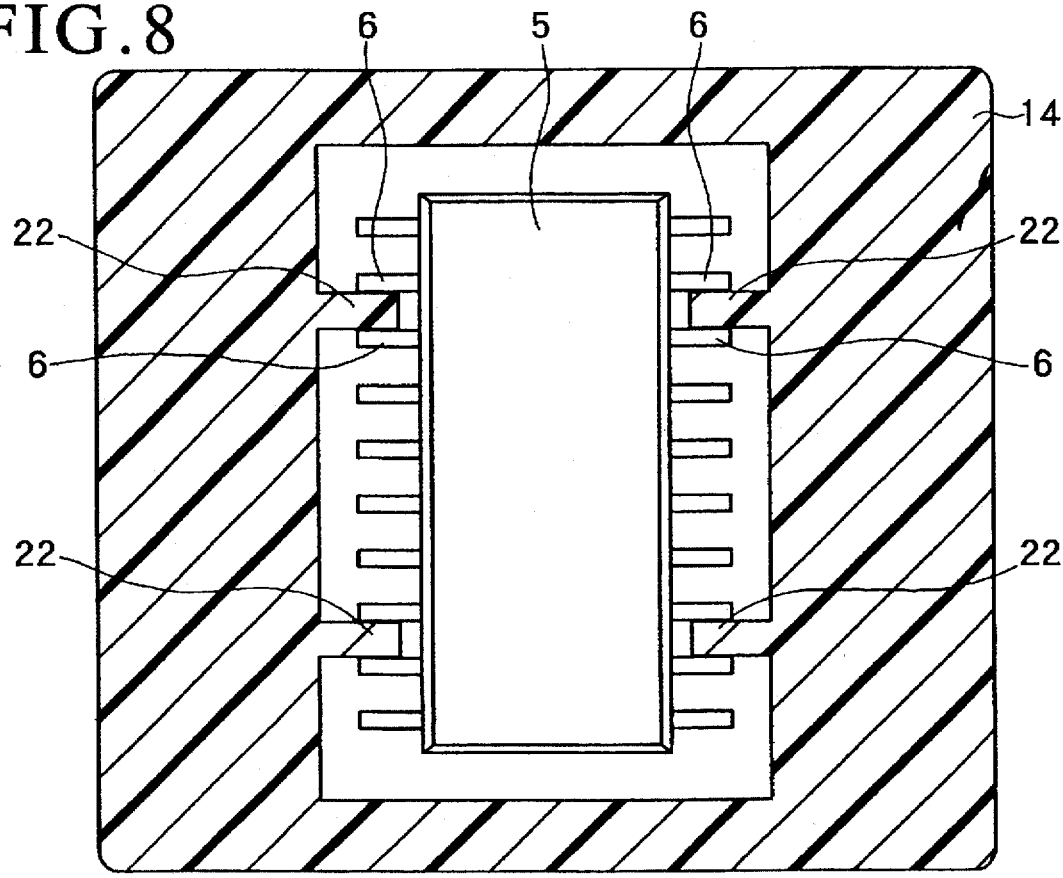
FIG. 8 is a cross-sectional view schematically showing leads of an IC package correctly positioned by the contact shutter cover.
Figure 9:
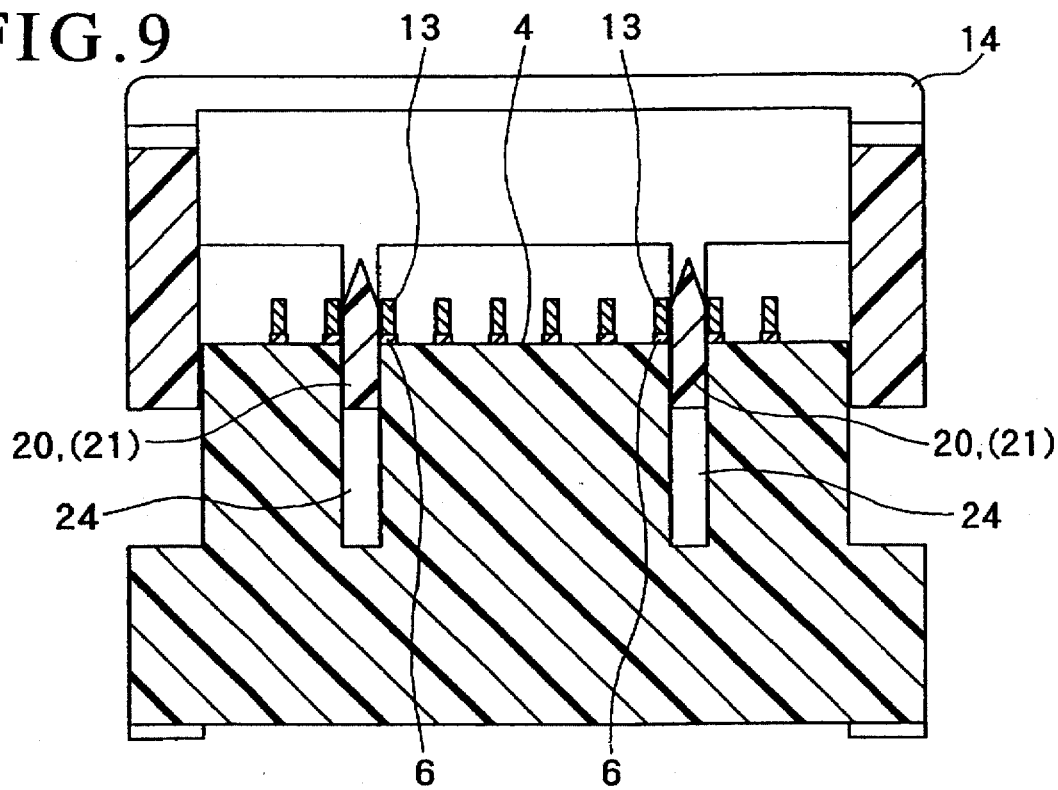
FIG. 9 is a cross-sectional view schematically showing IC leads and contacts correctly positioned by the contact shutter cover.

Further, as shown in FIG. 7(A), when the press-down force exerted on the press-in control portion 16 of the cover 14 is removed, the contact piece 12 of the contact is displaced forwardly by the force of the spring 11 so that the projection 13 is brought into press-in contact with the upper surface of the IC lead 6. Also, by this restoring force of the spring 11, the cantilevered arm 18 is caused to push the cover 1 upwardly into a standby position for the next press-down operation.

The contact shutter cover 14 is provided with a positioning means for restricting the side surface of the IC lead 6 or both the side surface of the IC lead 6 and the side surface of the contact 3. Preferably, the cover 14 is provided with a positioning means for restricting side surfaces of contacting portions of the IC lead 6 and the contact 3.

The contact shutter cover 14 has a positioning restricting wall, as the positioning means, interposed between adjacent IC leads 6, 6, or between adjacent IC leads and adjacent contacts 3, 3 corresponding to the adjacent IC leads, or between the contacting portions of adjacent leads 6, 6 and adjacent contacts 3, 3.

Figure 5A:
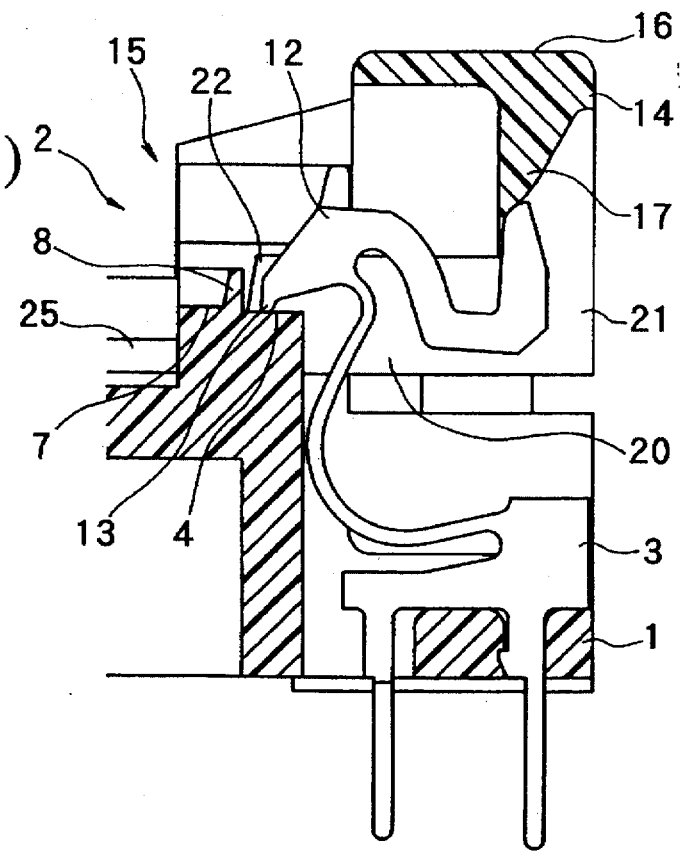
FIG. 5(A) is a sectional view of an important portion of a socket, taken on a line extending along a side surface of a contact when the contact shutter cover is in its lifted position.
Figure 5B:
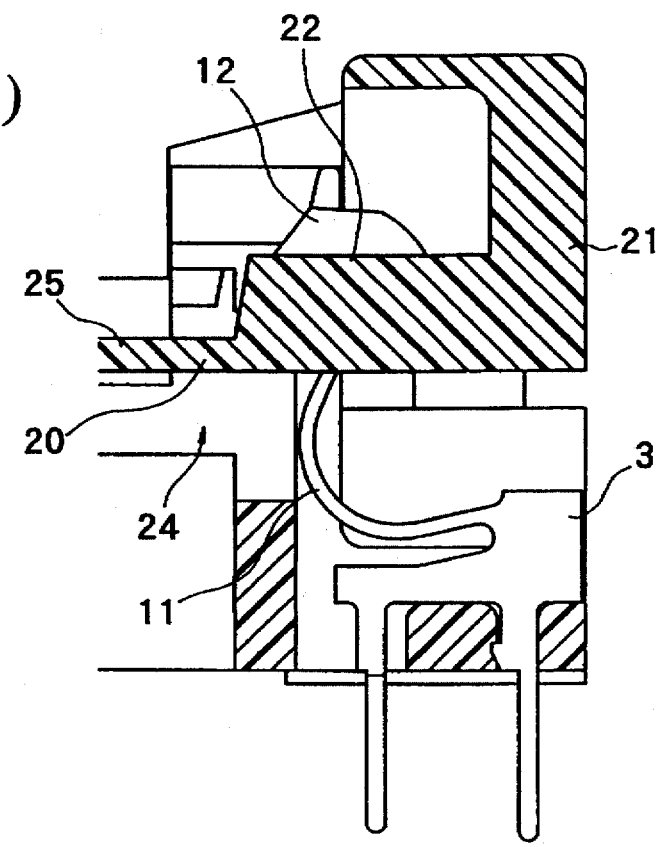
FIG. 5(B) is likewise a sectional view of the important portion, taken on a line extending along a separate bar in the state of FIG. 5(A)

As a means for forming the positioning restricting wall, a plurality of separation bars 20 transversing the IC receiving portion 2 as shown in FIGS. 1, 5(A) and 5(B), as well as elsewhere, are disposed in parallel relation with the cover 14. Opposing ends of those separation bars 20 are connected to the opposing frame walls defining the IC inserting and removing window 15, or the frame wall forming the press-in control portion 16.

The opposite end portions of each separation bar 20 form first restriction wall portions 21 interposed between the cantilevered arms 18 of adjacent contacts 3. The contact press-in portion 17 is formed on the upper bottom portion between first restriction wall portions 21.

Each separation bar 20 is allowed to extend from the first restriction wall portion 21 toward the IC receiving portion 2.

That portion of the separation bar 20, which is allowed to extend toward the IC receiving portion 2, is interposed between the contact portions of the IC lead 6 and the press-in contacting projection 13. A second restricting wall portion 22 for restricting the side surface of the contact portion of both the lead 6 and the contact 3 is formed by this interposing portion.

As above mentioned, the first and second restricting wall portions 21, 22 are provided by the separation bars 20 of the cover 14. In the above embodiment, the positioning means provided on the cover 14 provides a structure for correctly positioning the IC leads 6 by restricting the side surfaces thereof and also provides a structure for correctly positioning the side surfaces of the contacts 3 while restricting the side surfaces of the IC leads 6.

The support seats 4, 7 are provided respectively with grooves 24 formed in parallel relation and allowing the separation bars 20 to be inserted therein. The second restriction wall portions 22 are inserted into the grooves 24, and the separate bars 20 are movable upwardly and downwardly within the grooves 24.

Figure 2:
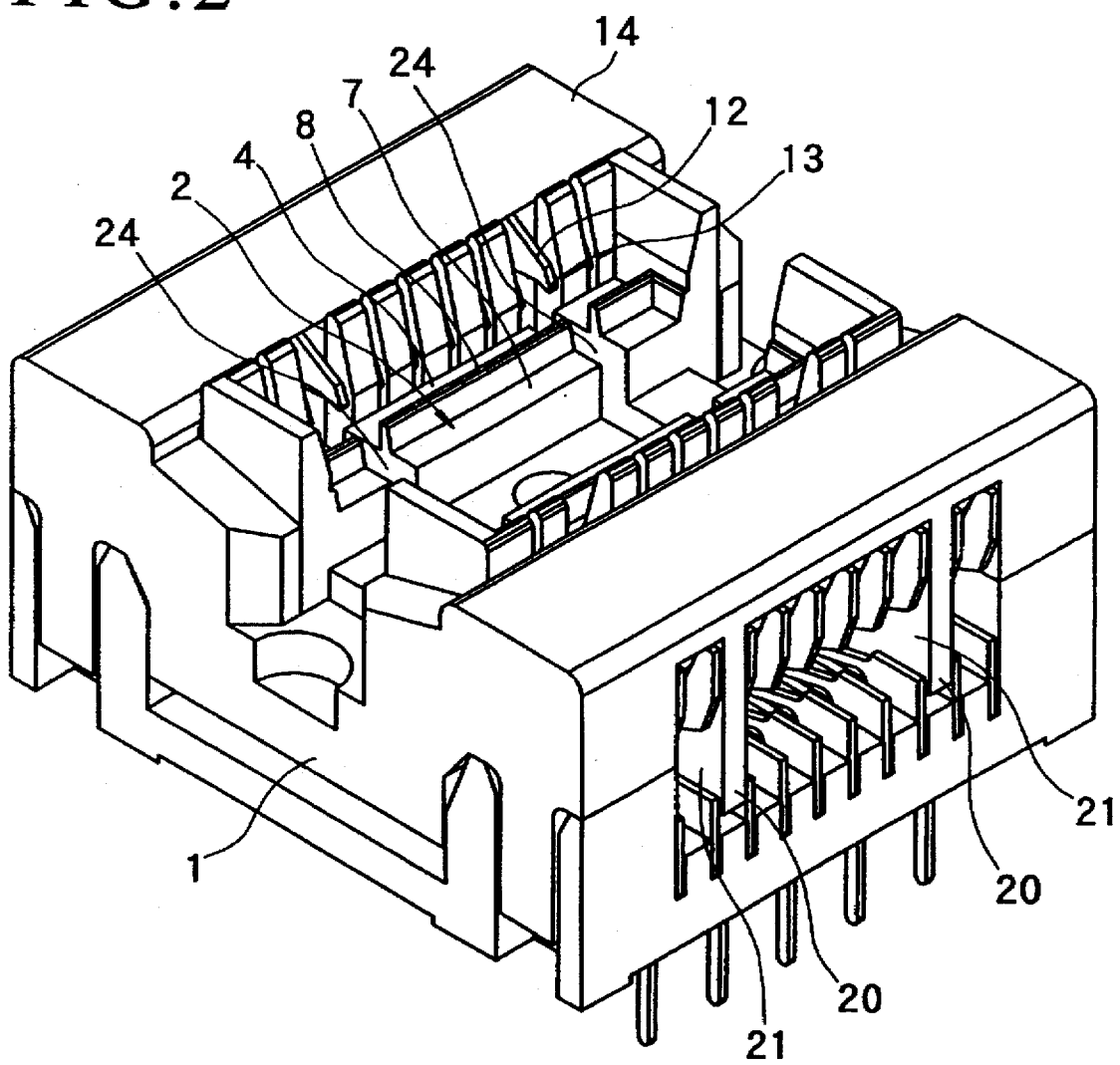
FIG. 2 is likewise a perspective view of a socket for an IC package according to one embodiment of the present invention, but in which the contact shutter cover is in its lowered position.
Figure 3:
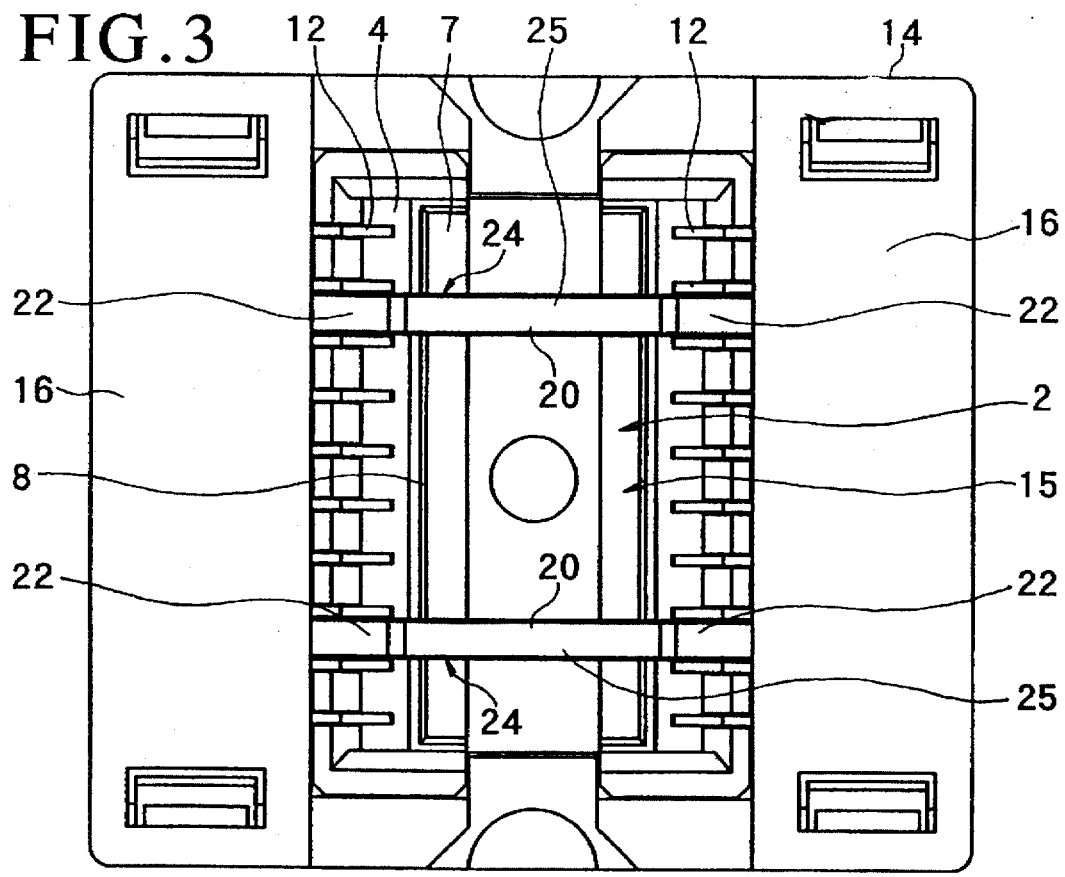
FIG. 3 is a plan view of the socket which is in the state of FIG. 1.
Figure 4:
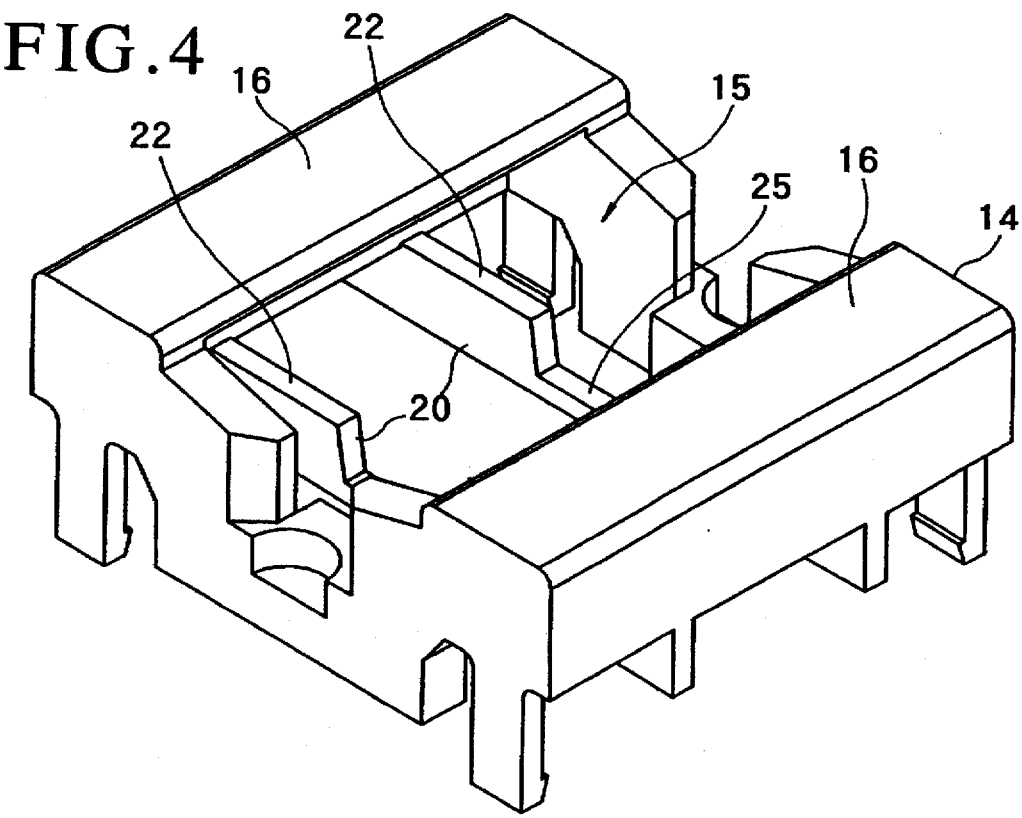
FIG. 4 is a perspective view of a contact shutter cover which is designed to be used for the above socket.

As shown in FIGS. 2, 6(A) and 6(B), as well as elsewhere, when the cover 14 is lowered, the second restriction wall 22 is downed into the groove 24 so that the second restriction wall portion 22 is located in position lower than the seat surfaces 4, 7. On the other hand, as shown in FIGS. 1, 5(A), 5(B), 7(A) and 7(B), as well as elsewhere, when the cover 14 is lifted upwardly, the second restriction wall portion 22 is moved upwardly from inside the groove 24 so as to be interposed for restriction of the side surfaces of the leads 6 and contacts 3, or between the contact portions 23 of the contact 3 and lead 6.

The separation bars 20 and the grooves 24 provided on the cover 14 are disposed in parallel relation. The positioning means represented by the separation bars 20, and the cover 14 are integrally molded of an insulative material such as synthetic resin.

The separation bars 20 are provided integrally with the cover 14 in such a manner as to transverse the IC inserting/ removing window 15 and the IC receiving portion 2 formed in the socket body 1. As another example, each separate bar 20 is divided at its central portion so that first and second restriction wall portions 22 can be separated leftwardly and rightwardly.

That is, the opposing frame walls of the contact shutter cover 14 are separated into one and the other to provide the second restriction wall portion 22 for restricting the side surfaces of the contacting portions of the leads 6 and the contacts 3, or to provide a wall portion for restricting the side surfaces of the contacting portions, or to provide a wall portion for restricting the side surfaces of the contact portions of the lead 6 and the contacts 3.

The separation bars 20 are interconnected by a central connecting portion 25, thereby reinforcing the frame wall of the cover 14. Aside from the example for integrally forming the positioning means disposed on the cover 14 with the cover body, there is another acceptable example in which the positioning means such as the separate bars is formed of a separate part and the same is mounted on the cover body.

The cover 14 may be either of the two types: the first type is that when the cover 14 is lowered, the contact is displaced backwardly into the contact releasing position and the second type is that when the cover 14 is lowered, the contact is displaced forwardly into the contacting position.

The positioning means for restricting the side surface of the IC lead 6, the side surface of the contact 7, or the contacting portions 23 of the IC lead 6 and the contact 7 is interposed for correct positioning of the respective parts between the adjacent leads 6, 6, between adjacent leads 6, 6 and the contacts 7, 7, or between the contacting portions 23 of the leads and contacts.

In the case where the contact shutter cover 14 urges the contact 3 against the lead 6 (displaced forwardly) to establish a contacting state when the contact shutter cover 14 is lowered and causes the contact 3 to be spaced apart from the lead 6 to establish a non-contacting state when the contact shutter cover 14 is lifted upwardly, the positioning means is moved from the lifted position to the lowered position together with the cover 14, in order to restrict the side surfaces of the respective parts.

In the case where the contact 3 are opened and closed by means of the upward and downward movement of the contact shutter cover 14, the side surface of the lead 6 or the side surfaces of the lead 6 and contact 3 or the side surfaces of the contacting portions 23 of the lead 6 and contact 3 can be restricted during the entire process of the upward and downward process.

In the illustrations, a pair of separation bars 20 or a pair of second restricting walls 22 are provided in parallel relation. It should be noted, however, that the present invention includes a case in which three or more separation bars 20 or second restriction wall portions 22 are provided for each row of the contacts and leads 6.

The positioning means as represented by the second restriction wall portion 22 provided on the cover 14 correctly positions the respective parts by being interposed between adjacent leads 6 or between the contacting pieces 12 of adjacent contacts 3 or between the contacting portions of the contact 3 and the lead 6. It should be noted that the present invention also includes a case in which the outer side surface of the lead located on the end of a row in the group of the IC leads or the outer surfaces of contacts disposed on an end of the row and the side surface of the contacting portion of each terminal of the lead of the end of the row are restricted.

According to the present invention, while the contacts are opened and closed by the cover, the positioning means provided on the cover restricts the side surfaces of the IC leads, the side surfaces of the IC leads and side surfaces of the contacts, or the side surfaces of the contacting portions of the IC leads and the contacts, so that the contacts are reliably coincide with the leads, respectively.

Further, owing to the arrangement where the leads and contacts are correctly positioned by the cover as a common member, a one-to-one relation between each lead and each contact can more positively be achieved.

Moreover, the problem of deforming the leads by the partition wall when an IC package is loaded, will no longer occur, unlike in the case where the partition wall provided on the socket body is interposed between adjacent leads.

What is claimed is:

1. A socket for an IC package, said socket comprising:

a socket body;

a plurality of contacts provided on said socket body for contacting leads of an IC package, said plurality of contacts being movable between a contacting position and a release position;

a contact shutter cover movably mounted on an upper surface of said socket body, said contact shutter cover being upwardly and downwardly movable relative to said socket body; and a positioning means provided on said contact shutter cover and being disposed relative to said socket body such that, when an IC package is inserted in said socket body, said positioning means can be located adjacent side surfaces of IC package leads on the IC package in order to restrict movement thereof, wherein upon upward movement of said contact shutter cover, said contacts move into said contacting position to contact the leads of the IC package at a lead contact location and said positioning means is moved upwardly from a position below said lead contact location to a position adjacent the side surfaces of the IC package leads.

2. A socket for an IC package, said socket comprising:

a socket body including an IC package support seat defining a groove;

a plurality of contacts provided on said socket body for contacting leads of an IC package;

a contact shutter cover movably mounted on an upper surface of said socket body, said contact shutter cover being upwardly and downwardly movable relative to said socket body; and a positioning means provided on said contact shutter cover for restricting movement of leads of an IC package inserted in said socket body, said positioning means being located so as to move into and out of said groove upon upward and downward movement of said contact shutter cover.

3. A socket for an IC package, said socket comprising:

a socket body;

a plurality of contacts provided on said socket body for contacting leads of an IC package, said plurality of contacts being movable between a contacting position and a release position;

a contact shutter cover movably mounted on an upper surface of said socket body, said contact shutter cover being upwardly and downwardly movable relative to said socket body; and a positioning means provided on said contact shutter cover and being disposed relative to said socket body such that, when an IC package is inserted in said socket body, said positioning means can be located adjacent side surfaces of IC package leads of the IC package and side surfaces of said contacts in order to restrict movement thereof, wherein upon upward movement of said contact shutter cover, said contacts move into said contacting position to contact the leads of the IC package at a lead contact location and said positioning means is moved upwardly from a position below said lead contact location to a position adjacent the IC package leads and said side surfaces of said contacts.

4. A socket for an IC package, said socket comprising:

a socket body including an IC package support seat defining a groove;

a plurality of contacts provided on said socket body for contacting leads of an IC package;

a contact shutter cover movably mounted on an upper surface of said socket body, said contact shutter cover being upwardly and downwardly movable relative to said socket body; and a positioning means provided on said contact shutter cover for restricting movement of said contacts and leads of an IC package inserted in said socket body, said positioning means being located so as to move into and out of said groove upon upward and downward movement of said contact shutter cover.

5. A socket for an IC package, said socket comprising:

a socket body;

a plurality of contacts provided on said socket body for contacting leads of an IC package, said plurality of contacts being movable between a contacting position and a release position;

a contact shutter cover movably mounted on an upper surface of said socket body, said contact shutter cover being upwardly and downwardly movable relative to said socket body; and a positioning means provided on said contact shutter cover and being disposed relative to said socket body such that, when an IC package is inserted in said socket body, said positioning means can extend between side surfaces of contacting portions of the leads of the IC package and said contacts, wherein upward movement of said contact shutter cover allows said contacts to move into said contacting position to contact the leads of the IC package at a lead contact location and said positioning means is moved upwardly from a position below said lead contact location to a position adjacent the side surfaces of the IC package leads and said contacts at said lead contact location.

6. A socket for an IC package, said socket comprising:

a socket body including an IC package support seat defining a groove;

a plurality of contacts provided on said socket body for contacting leads of an IC package;

a contact shutter cover movably mounted on an upper surface of said socket body, said contact shutter cover being upwardly and downwardly movable relative to said socket body; and a positioning means provided on said contact shutter cover for restricting movement of contacting portions of leads of an IC package inserted in said socket body and said contacts, said positioning means being located so as to move into and out of said groove upon upward and downward movement of said contact shutter cover.

* * * * *